(12) United States Patent
Patin

(10) Patent No.: US 6,516,451 B1
(45) Date of Patent: Feb. 4, 2003

(54) STANDARDS-INTEGRATED DESIGN SOFTWARE

(76) Inventor: Clarence Wayne Patin, 7439 Foxton Place Ct., Houston, TX (US) 77095

(*) Notice: Subject to any disclaimer, the term of this patent is extended or adjusted under 35 U.S.C. 154(b) by 274 days.

(21) Appl. No.: 09/610,851

(22) Filed: Jul. 5, 2000

(51) Int. Cl.$^7$ .............................................. G06F 17/50
(52) U.S. Cl. ................. 716/4; 716/5; 700/103
(58) Field of Search ............................ 716/1–4, 18, 5; 700/103, 97, 104; 706/47

(56) References Cited

U.S. PATENT DOCUMENTS

| | | | |
|---|---|---|---|
| 2,796,683 A | 6/1957 | Hayne | 35/19 |
| 3,074,181 A | 1/1963 | Watson | 35/7 |
| 5,251,159 A | 10/1993 | Rowson | 364/578 |
| 5,422,833 A | 6/1995 | Kelem et al. | 364/578 |
| 5,969,973 A | * 10/1999 | Bourne et al. | 700/165 |
| 5,980,084 A | * 11/1999 | Jones et al. | 700/103 |
| 6,295,513 B1 | * 9/2001 | Thackston | 703/1 |
| 6,351,734 B1 | * 2/2002 | Lautzenheiser et al. | 700/99 |

* cited by examiner

Primary Examiner—Matthew Smith
Assistant Examiner—Paul Dinh
(74) Attorney, Agent, or Firm—Patent & Trademark Services; Thomas Zack; Joseph H. McGlynn

(57) ABSTRACT

A computer process used to create a report to check a proposed project to insure conformity with existing standards. The software used utilizes a diagrammatic design program which allows creation of a model while checking compliance with the standard used in the proposed project. In the preferred embodiment example given, the method would first create a new project or open an existing project. Thereafter, the user would select a list of modules from rules algorithms for standards relating to the created or opened existing project. Next, the project would be designed by adding component parts and modifying their properties while maintaining compliance with the selected standards. Finally, a report, whether checklists, graphical layouts with dimensions or worksheets that enable the user to create a dimensioned graphical layout, would be created to demonstrate compliance with the selected standard. The screen displayed components and the standards are modularized to allow changing of both to suit a particular need. In the example program given electrical system manger (ESM), the selected project related to the electrical building industry and the standard used the current National Electrical Code.

5 Claims, 6 Drawing Sheets

STANDARDS-INTEGRATED DESIGN SOFTWARE

BACKGROUND OF THE INVENTION

This invention relates to a computer method that utilizes a software diagrammatic design program to create a design model while constantly checking standards to insure conformity with existing standards, such as building or safety codes.

Various types of methods have been developed to teach or assist, or both, users of existing standards. For example, in one such method an electrical demonstration program is disclosed that is used to teach the proper use of electrical appliances In another earlier invention, a modular diagraming method is disclosed that is used to prepare graphic representations.

One other prior art method consists of a software program with analysis simulation results and provides such results in terms that are familiar to the user. Still another related invention discloses a software program which uses a CAD (Computer Aided Design) program to automatically propagate the data types throughout the design to achieve program consistency.

DESCRIPTION OF THE PRIOR ART

Methods and programs that assist users have been developed in a vary of ways. For example, in the U.S. Pat. No. 2,796,683 to Hayne discloses there is disclosed a method used in an electrical demonstration program that teaches the proper use of electrical appliances.

U.S. Pat. No. 3,074,181 to Watson discloses a modular diagraming method used to prepare graphic representations.

U.S. Pat. No. 5,251,159 to Rowson discloses a software program which analysis simulation results and provides such results in terms that are familiar to the user.

U.S. Pat. No. 5,422,833 to Kelem et al. discloses a software program which uses a CAD program to automatically propagate the data types throughout the design to achieve program consistency.

In the present invention a computer uses a software diagrammatic design program to constantly check standards to insure conformity with existing codes, such as building or safety codes, all as will be detailed in the specification that follows hereafter.

SUMMARY OF THE INVENTION

This invention relates to a computer-based method that utilizes a software diagrammatic design program to create a design model while constantly checking technical standards to insure conformity with existing standards or codes.

It is the primary object of the present invention to provide for an improved method to model a complex system while maintaining compliance with technical standards or codes, including the creation of calculations, detail diagrams, reports, or the like that demonstrate full compliance of the system with the requirements of those standards.

Another object is to provide for a method in which technical standards exist as independent modules containing rules algorithms. Standards modules related to the design would be listed in the program, providing the user a selection of primary and supplementary standards that could be applied to the design model.

Yet another object is to provide for such a method in which the model is created diagrammatically using independent components, or parts, whose individual properties, settings, and interrelationships can be interactively modified by the user while maintaining compliance with the selected standards.

These and other objects and advantages of the present invention will become apparent to readers from a consideration of the ensuing description and the accompanying drawings.

DESCRIPTION OF THE PREFERRED EMBODIMENT

FIGS. 1–5 are views of a software program titled "Electrical System Manager" (ESM), created using the functions and concepts of the present invention and, therefore, used as representations to explain those functions and concepts.

The particular physical product description for the preferred embodiment of the invention was developed for the Microsoft Windows 95/98/2000 operating system. The computer files consisted of one executable and a varying number of module files each containing binary code. The module files are dependent on and dynamically loaded by the executable file. This modular software architecture is fundamental within the Microsoft operating system.

The term "Standards-Integrated Design Software" (SIDS) describes the software architecture and design concepts used by and in the creation of software applications that allow a user to perform the following steps:

a. Select from a list of modules containing the rules algorithms of the standard, code or industry specification (each of which is individually or collectively hereinafter referred to as the standard or standards) that will govern the development of the design.

b. Design a system diagram from component parts (usually represented by tiles) that is compliant with the selected standard or standards by modifying their properties and interrelationships within an environment that interactively coordinates the design model with the rules of the governing standard(s).

c. Create reports, calculations, detail diagrams (with dimensions) and the like that effectively demonstrate compliance with the user selected standard(s).

The SIDS architecture functions and design concepts can be used in the creation of many software programs, each specifically targeted for developing specification-compliant products and systems.

One such software program, Electrical System Manager (ESM), in development by the inventor, is a Windows 95/98/2000 stand-alone executable that facilitates modeling of an electrical distribution system fully compliant to the National Electrical Code (ANSI NFPA 70). This is a national standard adopted as a legally binding electrical construction code by all states in the United States of America and most local authorities. Other standards that may eventually be included in the final product are the local electrical building codes issued by some municipalities as amendments to the National Electrical Code.

Another possible implementation of the SIDS architecture could be creation of a program facilitating the design of a boiler system in full compliance with the American Society of Mechanical Engineers Boiler Code.

Figure 1:
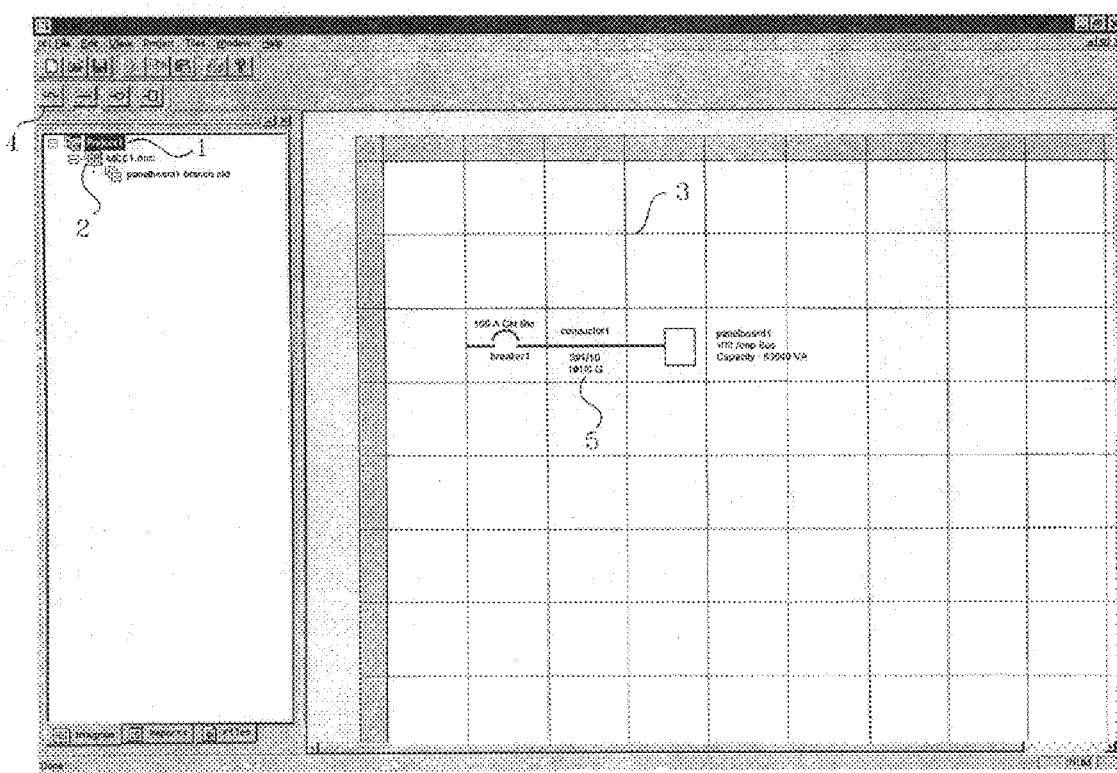
FIG. 1 is a view of the main window showing the design grid and tiles inserted by the user.

FIG. 1 is a view of the main window of the Electrical System Manager program with a design grid and inserted tiles. Data files produced using the SIDS architecture are grouped into "projects" or workspaces, as represented by the folder icon named "Project 1", labeled as 1. Only a single project can be created, opened, modified, or all, at one time. Project data for a typical project can be stored on several types of data files 2.

When a new design project is setup, part of the project initialization is the selection by the user of the standard(s) that the user wants the design to conform to, and the selection of versions of parts components. For the example of ESM, the choice of standards could be which edition of the National Electrical Code to use (ie, 1996 or 1999), and which local code to add as a supplement. The choice of parts components might involve selecting between modules representing conductors approved for the European market or for the USA. After setup, selected standards and parts modules are loaded automatically when the project is opened.

Referring again to FIG. 1, after project initialization is complete, the main window is opened and a view representing a sheet of grid paper is displayed on the screen. This design grid 3 will usually contain a background that relates to the type of system under design. Also, a selection of individual parts within the context of the design grid will be displayed as a set of buttons on the toolbar of the main window 4. For instance, in this example the main design grid for ESM is named "MCC1" and represents a motor control center distribution cabinet. The data file created for it is named "MCC1.mcc" and the icon representing that data file is shown in the view at left 2.

Presently, four buttons for component parts representing standard equipment associated with a motor control center are shown: circuit breaker, conductor, motor and panel board. As more component part modules are programmed and added to the ESM program, the number of buttons will increase. The background graphic (not shown) for MCC1 will represent (diagrammatically) the electrical motor control center that the parts components connect to. This main design grid serves as a metaphor for a single-line diagram, an industry standard map for a power distribution system. The grid graphics are exportable to CAD-compatible file formats.

When the user opens (double-clicks) the panel board tile (shown inserted) another grid window opens ("PNL1") and a new data file will be created ("PNL1.pnl"), displaying a background diagrammatically representing a panel board. A new set of buttons will appear showing panelboard-associated equipment, such as receptacles and appliances. Thus the mapping of the power distribution system will be continuous from the largest power transformers to the smallest receptacle.

In this method a model, within a SIDS program, can be created by the user in a series of hierarchical levels, each with its own set of editable component parts and each level related to the other.

For the user, model creation begins by selecting and placing (dragging) the parts tiles onto the design grid, as shown by 5 in FIG. 1. The placement of the tiles is constrained with respect to the grid background and each other. The constraints are governed by the rules of the standard(s) and design parameters of the application itself. For example, in the design parameters in ESM a transformer tile could not be placed next to a switch tile—a conductor tile would be required between them, corresponding to real world relationships between electrical components.

Figure 2:
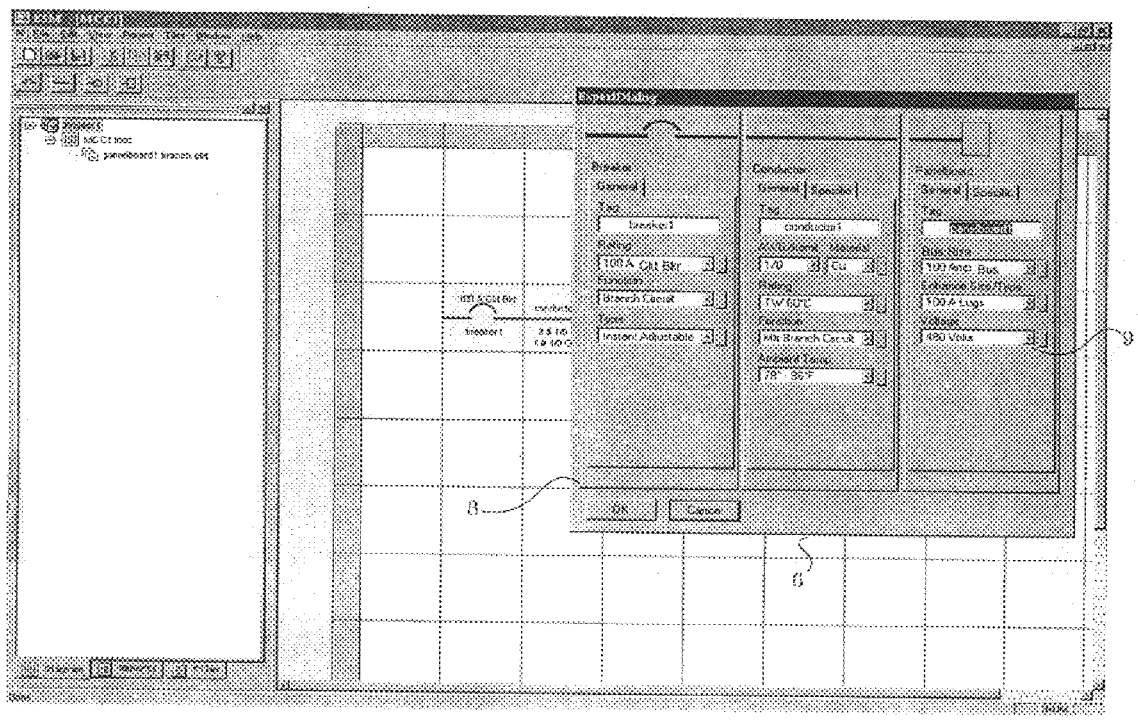
FIG. 2 is a view of the expert system dialog window opened.

FIG. 2 is a view of the expert system dialog window opened. This is a popup window that communicates between the user, the governing specification and the properties of the selected component parts. After placing a tile or a group of tiles 6 representing a logical entity within the context of the application, the tile or tile group can be "opened". The user selects and opens (double-clicks) the tile or tile group and a popup window, referred to as the expert system dialog, opens containing a property sheet 8 for each tile (component part).

Each property sheet displays the properties of its component part and the settings for each property. Property settings are displayed in an user-editable format, sometimes in an edit field or a button group, but usually in a drop-down selection list 9. Before the user changes a setting, items in each drop-down selection list are enabled or disabled by the expert system dialog, based on settings of other properties and/or the rules algorithms of the governing standards set up with the project. Optimal settings are flagged in the drop-down selection list, as a visual suggestion for the user. When the user changes the setting of a property, certain property settings of other tiles (component parts) will be immediately changed by the expert system dialog, based again on the governing standards' rules algorithms.

In the ESM application, for instance, when the user revises the size setting of a panel board property sheet, the size setting of the conductor property sheet will automatically change based on conductor ampere capacity tables in the National Electrical Code. In turn this change will also affect the size setting of the circuit breaker property sheet, which is based on the standard ratings for overcurrent protective devices in the Code. The enabled/disabled status of settings in the selection list of the conductor size property also changes, disabling those size selections that, according to the Code, are too small to carry the ampere load of the panelboard's new selected size.

The complex organization of dependencies between the component parts' property sheets and the rules algorithms of the standards is managed by the expert system dialog in the form of a messaging scheme between the component parts modules, the expert system dialog itself and the standards modules, and provides a real-time interaction between the user and the program. Use of binary code modules and message intercommunication is a feature of Microsoft Component Object Model technology and is fundamental in Microsoft Windows operating systems.

Figure 3:
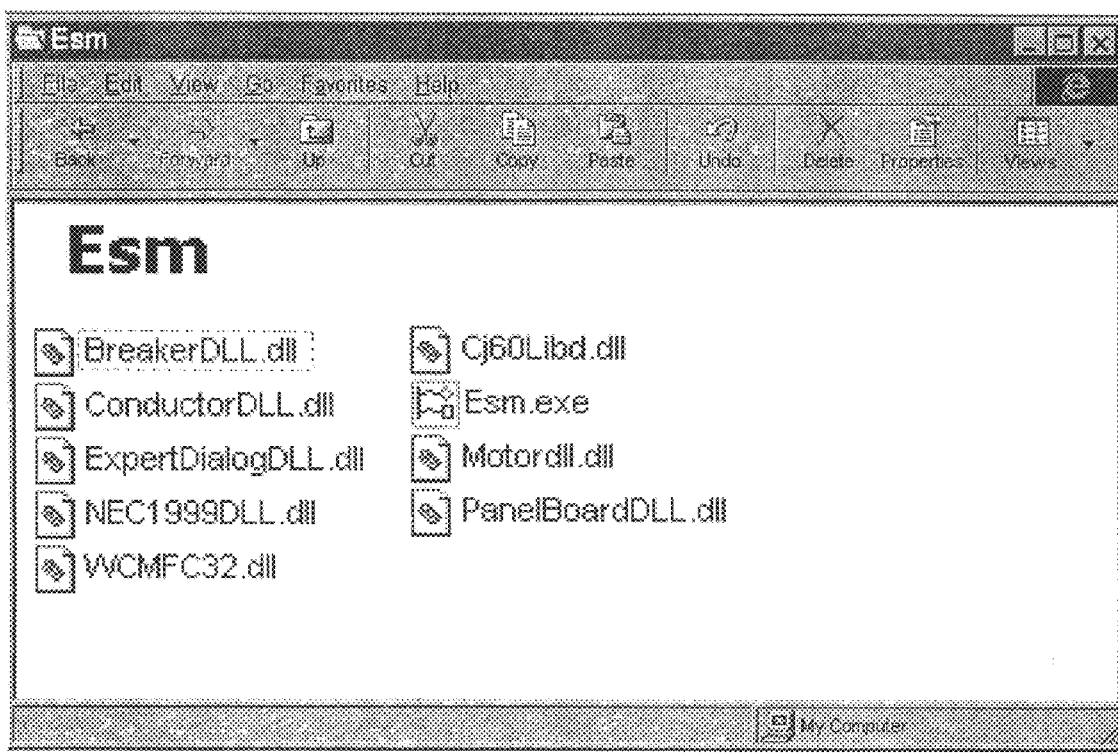
FIG. 3 shows a directory view of the ESM executable file (ESM.exe) and binary code modules used by the ESM program.

FIG. 3 is a view of the ESM program folder showing the executable (Esm.exe), component parts modules (BreakerDLL.dll, ConductorDLL.dll, MotorDLL.dll, PanelboardDLL.dll), expert system dialog module (ExpertDialogDLL.dll), standard module (NEC1999DLL.dll), and various program modules that control portions of the program's user interface. The use of modular design creates a compartmentalization that allows the user to easily upgrade program capabilities by replacing or adding component parts and standards modules (for example, adding a more recent motor component module having properties for the new class of high-efficiency motors). It also facilitates program development, management, and scalability for the developer.

Figure 4:
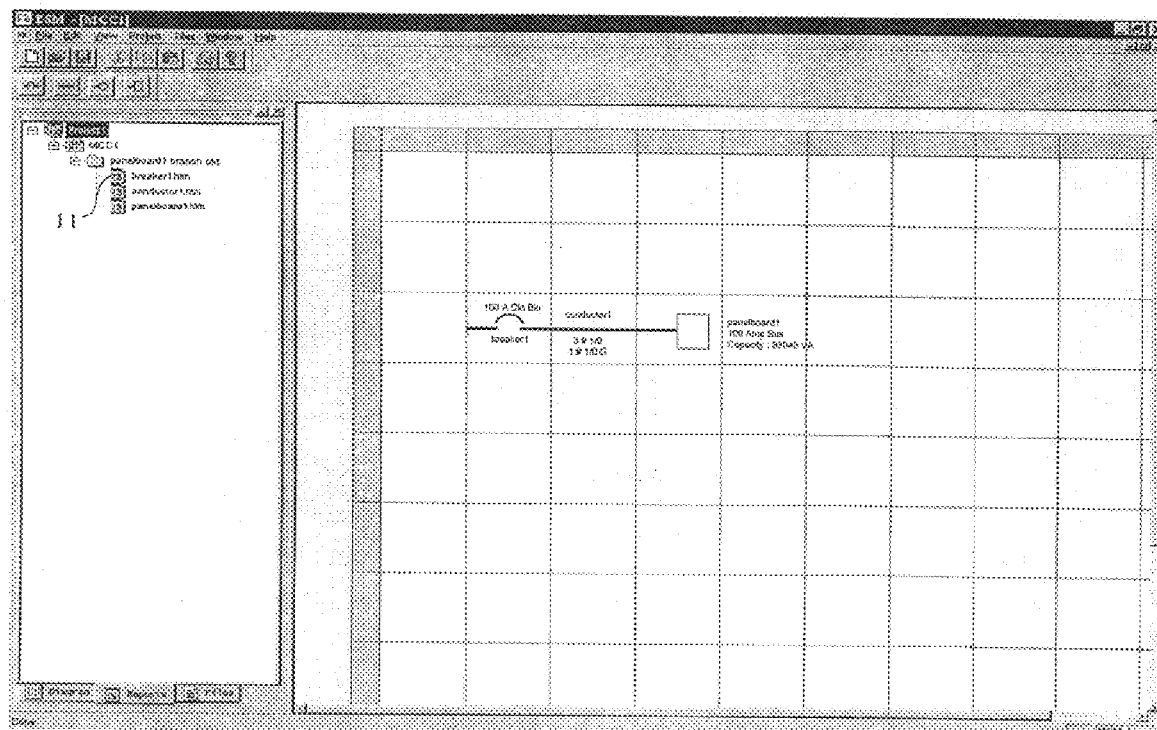
FIG. 4 shows a file list of compliance checklists created for the inserted tiles.

FIG. 4 shows in the left view of the main window a file list of the compliance reports created for each component part. These reports can be in several forms, such as:

1. checklists showing compliance with applicable sections of the governing standards, with detailed line-item calculations to support final conclusions; and/or
2. details showing graphical layouts with dimensions for sections of the standard that specify physical arrangements and relationships; and/or
3. worksheets that enable the user to create a dimensioned graphical layout interactively with the rules of the governing standard.

SIDS architecture uses an embedded "browser" to view all compliance reports. (Note:as used herein a browser is a generic reference to a computer program that interprets text files containing hypertext markup language—HTML files—and image files, formatting them into page layout.). Commonly, browsers such as Netscape Navigator and Microsoft Internet Explorer are stand-alone applications that manage and view Internet content based on the World Wide Web Hypertext Transfer Protocol. The SIDS embedded browser, however, is used only to view compliance reports of the SIDS program, which are initially created from templates delivered with the program and modified by the program based on user actions.

Embedding a browser to view HTML files is made technically feasible by Microsoft in their Windows operating system because the necessary component, an Internet Explorer control component, is contained within every installation of Windows 95/98/2000. A program created with SIDS architecture is compiled using the Microsoft Foundation Class framework which provides the final program, when started, a means of attaching the IE component that is transparent to the user.

Figure 5:
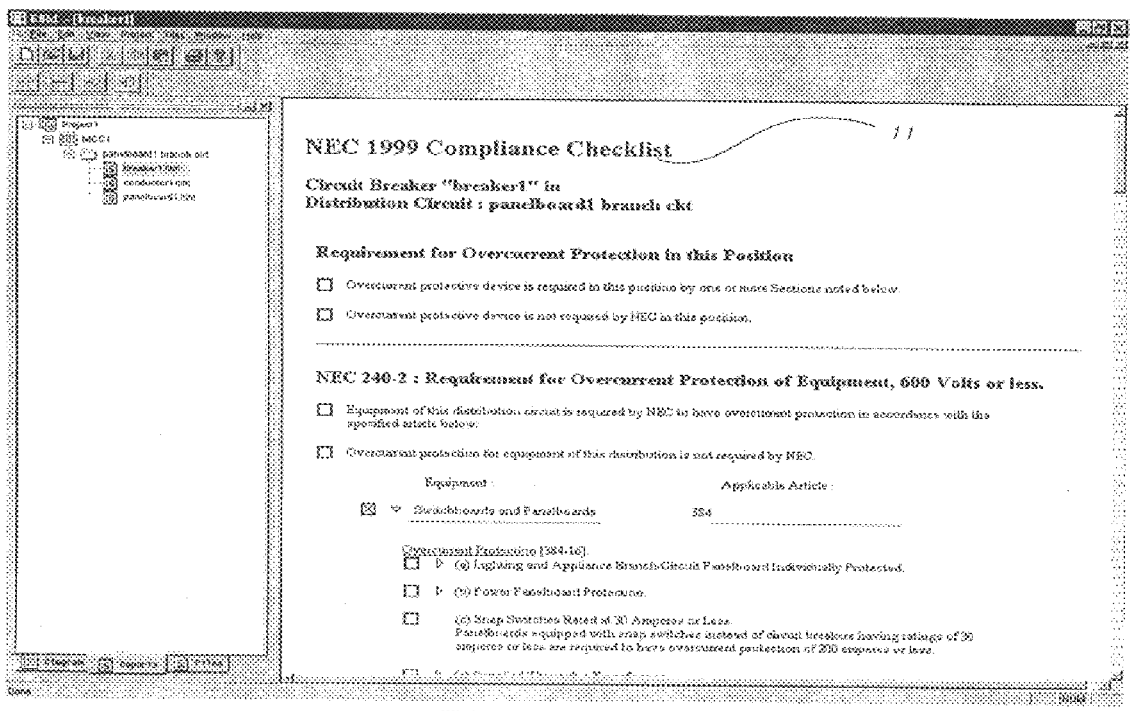
FIG. 5 is the circuit breaker compliance checklist.

FIG. 5 shows the ESM circuit breaker compliance checklist 11 viewed using the embedded browser. This view opens when the user double-clicks the file icon (e.g., item 11 in FIG. 4) for the circuit breaker compliance checklist. As stated earlier, the compliance checklists are created from a template included with the SIDS program. New versions of standards may affect the content of the templates, so it is beneficial to have the templates present as resources in the binary code of the standards module.

The compliance checklists, worksheets, and layout details are HTML files of text and graphics similar to those used in "web" pages. The advantage here is that using dynamic functions and elements of HTML, together with programming access to those functions and elements through the embedded browser, results in the ability to manipulate the content and appearance of the HTML files using Microsoft's dynamic HTML document object management technology. This gives the SIDS application full real-time control over display actions such as checking check boxes, changing dimensional and graphical data, closing and opening collapsible paragraphs, and adding/modifying content. Checklists, worksheets and layout details are modified by the program as the component part settings are modified by the user.

Figure 6:
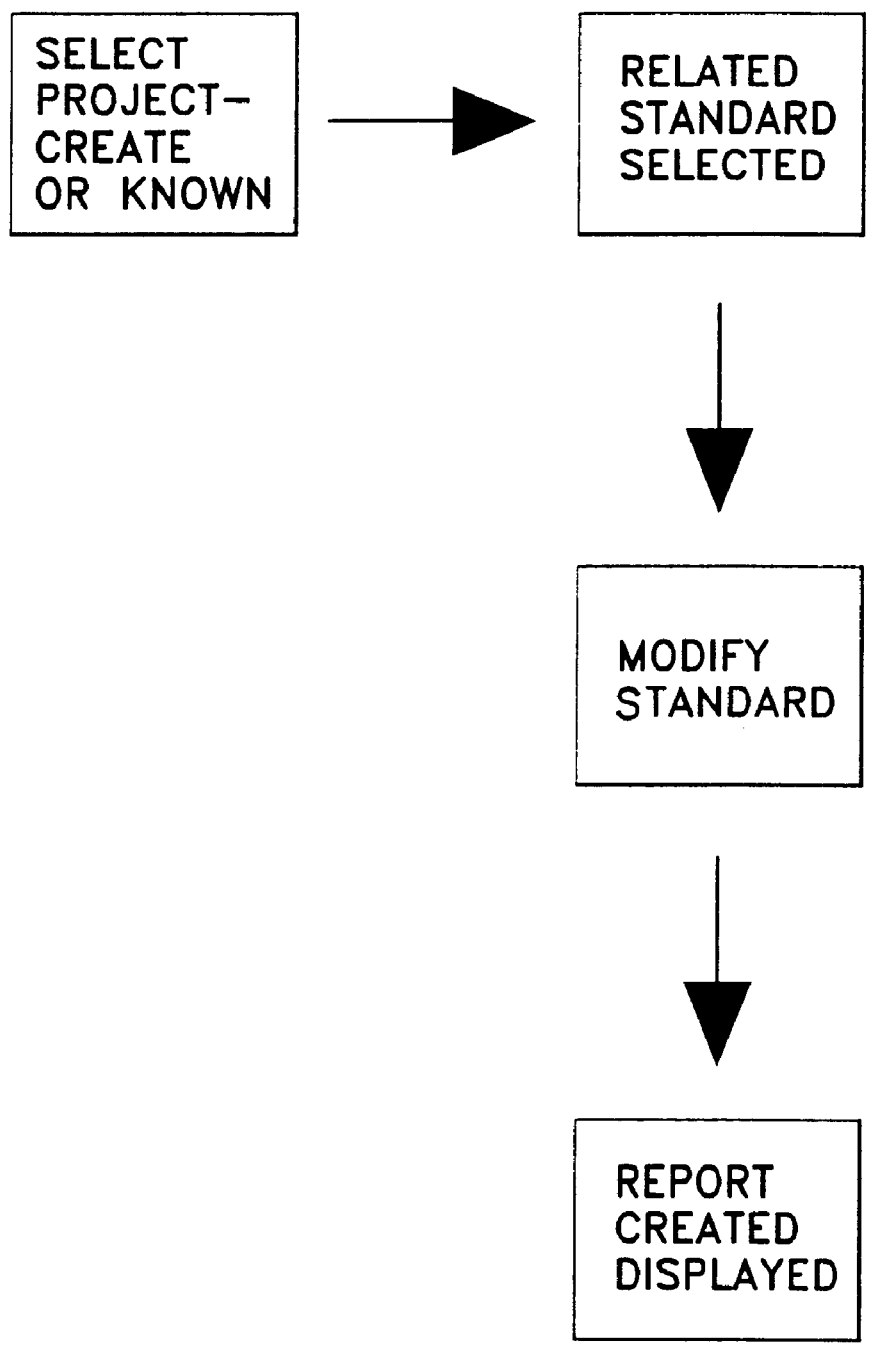
FIG. 6 is a block diagram of the major steps performed using this invention.

FIG. 6 is a block diagram of the major steps performed using this invention. Initially the user selects whether to use an existing project or to create a new project. If creating a new project, the user is given during setup a list of standards modules on his computer available to that SIDS program. The user selects which standards and which versions of those standards to use. The user is also given a list of applicable component parts that will be available, and if there is more than one version of a component part he is given a selection option.

If opening an existing project, the component choices made at setup will automatically be reloaded.

The user builds the project model by inserting component part tiles representing real world equipment or material. Insertion is accomplished using a tile-and-grid, drag-and-drop user interface. Properties of each component or component group are edited, and settings of other components are modified based on other property settings and rules algorithms within the loaded specifications.

Compliance reports and worksheets are created during component insertion and are modified during component editing. These reports can be viewed or printed during or after project design.

The SIDS application architecture offers an industrial or technical designer an efficient method for creating standards-compliant design, detailed supporting calculations, construction documentation, and an aid for learning standards whose language is often wordy and complex. For a client, inspector, local authority or insurance underwriter, a SIDS application offers documented proof of standards-compliant design. For maintenance, reports and diagrams created by the SIDS application as a byproduct of the design as well as the software project itself become a resource for maintaining and modifying the designed system.

The SIDS application example ESM can be a major productivity resource in the design and construction of facility power distribution systems while ensuring safety-compliance with the National Electrical Code. The resulting software would become a maintainable record to facilitate future additions and modifications to the distribution system. Successive editions of the Code, which is revised every three years, can easily be added to the user's program modules as well as other related standards, such as the National Electrical Safety Code (Institute of Electrical and Electronics Engineers) and the National Electrical Installation Standards (National Electrical Contractors Association).

Although the preferred embodiment of the present invention and the method of using the same has been described in the foregoing specification with considerable details, it is to be understood that modifications may be made to the invention which do not exceed the scope of the appended claims and modified forms of the present invention done by others skilled in the art to which the invention pertains will be considered infringements of this invention when those modified forms fall within the claimed scope of this invention.

What I claim as my invention is:

1. In a computer process a method used to create a compliance report using a software diagrammatic design program to check to insure conformity with existing standards, said method comprising the step of:

A creating a new project or opening an existing project relating to industrial technology of the building industry, B selecting a list of modules from rules algorithms of standards relating to a related technical standard or building code for the building industry of said created or opened project of step A, C designing a system diagram of parts compliant with the selected modules including sub component parts set forth in the selected standard or building code, D modifying any desired properties of the selected standards; and E creating a report to demonstrate compliance with the selected standards.

2. The method of claim 1, wherein said selected standard of step B relates to existing known technical standards forming part of a building code.

3. The method of claim 2, wherein said selected standard of step B relates to the existing technical standards of a building code and said designed sub component parts include related objects governed by said building code.

4. The method of claim 3, wherein said proposed standard relates to the electrical components of a building and said standard of step B includes the known existing electrical standards for a building code.

5. The method of claim 1, wherein said created report of step E includes the analysis of the created new project or existing project to demonstrate compliance with the selected standard.

* * * * *